United States Patent
Sears

(10) Patent No.: US 9,082,580 B2
(45) Date of Patent: Jul. 14, 2015

(54) NOTCHED MAGNETIC LENS FOR IMPROVED SAMPLE ACCESS IN AN SEM

(71) Applicant: KLA-Tencor Corporation, Milpitas, CA (US)

(72) Inventor: Christopher M. Sears, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/490,565

(22) Filed: Sep. 18, 2014

(65) Prior Publication Data

US 2015/0083926 A1    Mar. 26, 2015

Related U.S. Application Data

(60) Provisional application No. 61/881,351, filed on Sep. 23, 2013.

(51) Int. Cl.
*H01J 37/141*    (2006.01)
*H01J 37/28*    (2006.01)

(52) U.S. Cl.
CPC ............ *H01J 37/141* (2013.01); *H01J 37/28* (2013.01); *H01J 2237/1405* (2013.01)

(58) Field of Classification Search
USPC .................................................. 250/396 ML
See application file for complete search history.

(56) References Cited

U.S. PATENT DOCUMENTS

| | | | |
|---|---|---|---|
| 4,639,597 A * | 1/1987 | Shiokawa ................... 250/305 |
| 5,598,002 A * | 1/1997 | Todokoro et al. ............ 250/310 |
| 8,421,030 B2 | 4/2013 | Shadman et al. |
| 8,455,838 B2 | 6/2013 | Shadman et al. |
| 8,513,619 B1 | 8/2013 | Nasser-Ghodsi et al. |
| 8,633,457 B2 | 1/2014 | Nasser-Ghodsi et al. |
| 8,658,973 B2 | 2/2014 | Neil et al. |
| 8,698,094 B1 | 4/2014 | Sears et al. |
| 8,752,437 B2 | 6/2014 | Sears |

OTHER PUBLICATIONS

U.S. Appl. No. 61/881,351, to Christopher M. Sears, filed Sep. 23, 2013.

* cited by examiner

*Primary Examiner* — Kiet T Nguyen
(74) *Attorney, Agent, or Firm* — Joshua D. Isenberg; JDI Patent

(57) ABSTRACT

A magnetic immersion lens apparatus includes an outer pole piece and an inner pole piece with a gap therebetween proximate a common axis of the first and second pole pieces. The outer pole piece has an opening that permits energetic particles from a target in front of the immersion lens to pass through the outer pole piece to an external detector. The outer or inner pole piece has one or more notches near the gap, including at least one notch that expands cone of acceptance through which the energetic particles can pass from the target to the external detector. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

23 Claims, 6 Drawing Sheets

FIG. 4A
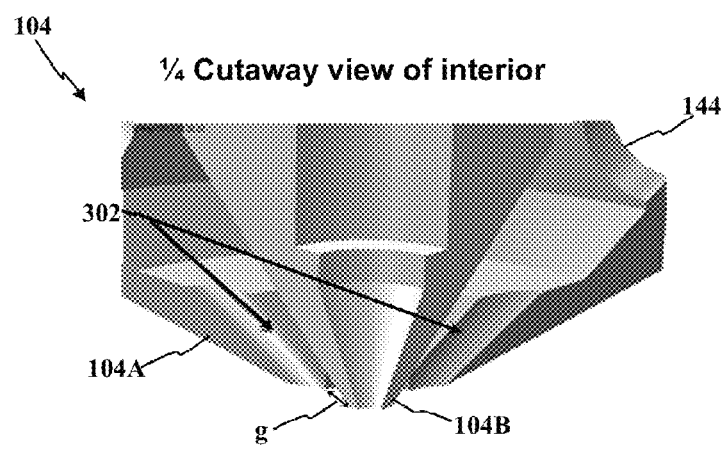
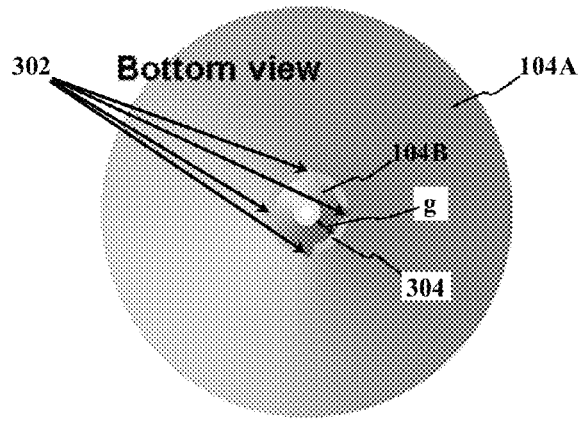
FIG. 4B

NOTCHED MAGNETIC LENS FOR IMPROVED SAMPLE ACCESS IN AN SEM

CLAIM OF PRIORITY

This application is a nonprovisional of and claims the priority benefit of commonly owned, U.S. Provisional Patent Application No. 61/881,351, to Christopher M. Sears, filed Sep. 23, 2013, and entitled "NOTCHED RADIAL GAP MAGNETIC LENS FOR IMPROVED SAMPLE ACCESS IN AN SEM" the entire disclosures of which are incorporated herein by reference.

FIELD OF THE INVENTION

Embodiments of the present invention relate to electron microscopy, and more particularly, to a modification to a common magnetic immersion lens for electron microscopy.

BACKGROUND OF THE INVENTION

Energy-dispersive X-ray spectroscopy (EDS, EDX, or XEDS), sometimes called energy dispersive X-ray analysis (EDXA) or energy dispersive X-ray microanalysis (EDXMA), is an analytical technique used for the elemental analysis or chemical characterization of a sample. It relies on an interaction of some source of X-ray excitation and a sample. Its characterization capabilities are due in large part to the fundamental principle that each element has a unique atomic structure allowing unique set of peaks on its X-ray spectrum.

An EDS system generally includes an excitation source (e.g., electron beam or x-ray beam), an X-ray detector, a pulse processor and an analyzer. An X-ray detector is used to convert the collected X-ray energy into voltage signals which are in turn sent to a pulse processor. The pulse processor measures the signals and passes them onto an analyzer for data display and analysis. The most common detector is Si(Li) detector cooled to cryogenic temperatures with liquid nitrogen. Silicon drift detectors (SDD) with Peltier cooling systems are also used.

Specifically, to stimulate the emission of characteristic X-rays from a sample, a high-energy beam of charged particles such as electrons or protons (e.g. in particle-induced X-ray emission or proton-induced X-ray (PIXE)), or a beam of X-rays, is focused into the sample being studied. At rest, an atom within the sample contains ground state (or unexcited) electrons in discrete energy levels or electron shells bound to the nucleus. The incident beam may excite an electron in an inner shell, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from a specimen can be measured by an energy-dispersive spectrometer. As the energy of the X-rays is characteristic of the difference in energy between the two shells, and of the atomic structure of the element from which they were emitted, this allows the elemental composition of the specimen to be measured.

Scanning electron microscopes (SEM) systems often have a magnetic immersion lens at the front of an electron optical column proximate the sample. The magnetic immersion lens typically has two pole pieces with rotational symmetry about a central axis of the electron optical column A magnetic field is produced in the pole pieces by one or more pairs of current carrying coils. There is a gap between the two pole pieces, which form a magnetic circuit. Fringing fields in the region near the gap focus or deflect electrons from the optical column. X-rays emitted from the target can pass through the gap to the X-ray detector. In SEM systems, it is desirable to increase access to X-rays emitted from the sample.

Previous methods for increasing access to the sample include moving sample further away from the lens, or increasing the gap between the lens pole pieces. Each of these ways of increasing access to the sample has disadvantages. Moving the sample away increases the electron spot size and thus decreases imaging resolution. Increasing the gap between magnetic pole pieces increases the magnetic reluctance of the circuit, thus requiring more current to achieve the same magnetic field. This in turn increases the heat dissipation within the lens which can have further deleterious effects on system performance.

It is within this context that aspects of the present disclosure arise.

SUMMARY

Aspects of the present disclosure include a system having a charged particle optical column configured to generate a primary beam of charged particles and focus the primary beam onto a target. A magnetic immersion lens is provided at a front of the column. The immersion lens has an outer pole piece and an inner pole piece with a gap therebetween proximate a common axis of the first and second pole pieces. The outer pole piece has an opening that permits energetic particles from the target to pass through the outer pole piece to an external detector. The inner or outer pole piece has one or more notches proximate the gap, including at least one notch that expands the cone of acceptance through which the energetic particles can pass from the target to the external detector.

In some implementations, the one or more notches may include two or more notches arranged in an axially symmetric pattern with respect to the axis of the charged particle column.

In some implementations, the one or more notches include three or more notches arranged in an axially symmetric pattern with respect to the axis of the charged particle column.

In some implementations, the one or more notches include four or more notches arranged in an axially symmetric pattern with respect to the axis of the charged particle column.

In some implementations, the notches may be made large enough to provide a desired access for the detector device to the target without increasing power needed to drive the immersion lens by more than 1%.

In some implementations, the outer pole piece may have a number of notches proximate the gap. In other implementations, the inner pole piece may have a number of notches proximate the gap. In still other implementations, both the inner pole piece and the outer pole piece have a number of notches proximate the gap.

In some implementations, the gap may be a radial gap. In other implementations, the gap may be an axial gap.

The system may optionally further comprise the external detector. In some such implementations, the external detector may be an X-ray detector. In certain particular implementations, the charged particle optical column may configured to generate a primary beam of electrons and focus the primary beam of electrons onto the target.

According to other aspects of the present disclosure a magnetic immersion lens apparatus may include an outer pole piece and an inner pole piece with a gap there between proximate a common axis of the pole pieces. The outer pole piece has an opening that permits energetic particles from a target in front of the immersion lens to pass through the outer pole piece to an external detector. The outer or inner pole piece has one or more notches proximate the gap, including at least one notch that expands cone of acceptance through which the energetic particles can pass from the target to the external detector.

In some implementations, the one or more notches include two or four or more notches arranged in an axially symmetric pattern with respect to the axis of the charged particle column.

In some implementations, the notches may be large enough to provide a desired access for the detector device to the target without increasing power needed to drive the immersion lens by more than 1%.

In some implementations, the outer pole piece has a number of notches proximate the gap. In other implementations, the inner pole piece has a number of notches proximate the gap. In still other implementations both the inner pole piece and the outer pole piece have a number of notches proximate the gap.

In some implementations, the gap is a radial gap. In other implementations, the gap is an axial gap.

According to other aspects, an outer pole piece for a magnetic immersion lens has an opening that permits energetic particles from a target in front of the immersion lens to pass through the outer pole piece to an external detector. The outer pole piece has one or more notches proximate a central aperture, including at least one notch that expands cone of acceptance through which the energetic particles can pass from the target to the external detector.

BRIEF DESCRIPTION OF THE DRAWINGS

Objects and advantages of the invention will become apparent upon reading the following detailed description and upon reference to the accompanying drawings in which:

FIG. 4A is a three-dimensional ¼ cutaway view of an interior portion of a magnetic immersion lens in accordance with an aspect of the present disclosure.

FIG. 4B is a bottom-up view of the magnetic immersion lens of FIG. 4A.

DETAILED DESCRIPTION

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. The embodiments can be combined, other embodiments can be utilized, or structural, logical, and electrical changes can be made without departing from the scope of what is claimed. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

As used herein, the term "light" generally refers to electromagnetic radiation characterized by a frequency somewhere in a range of frequencies miming from the infrared through the ultraviolet, roughly corresponding to a range of vacuum wavelengths from about 1 nanometer ($10^{-9}$ meters) to about 100 microns.

Figure 1A:
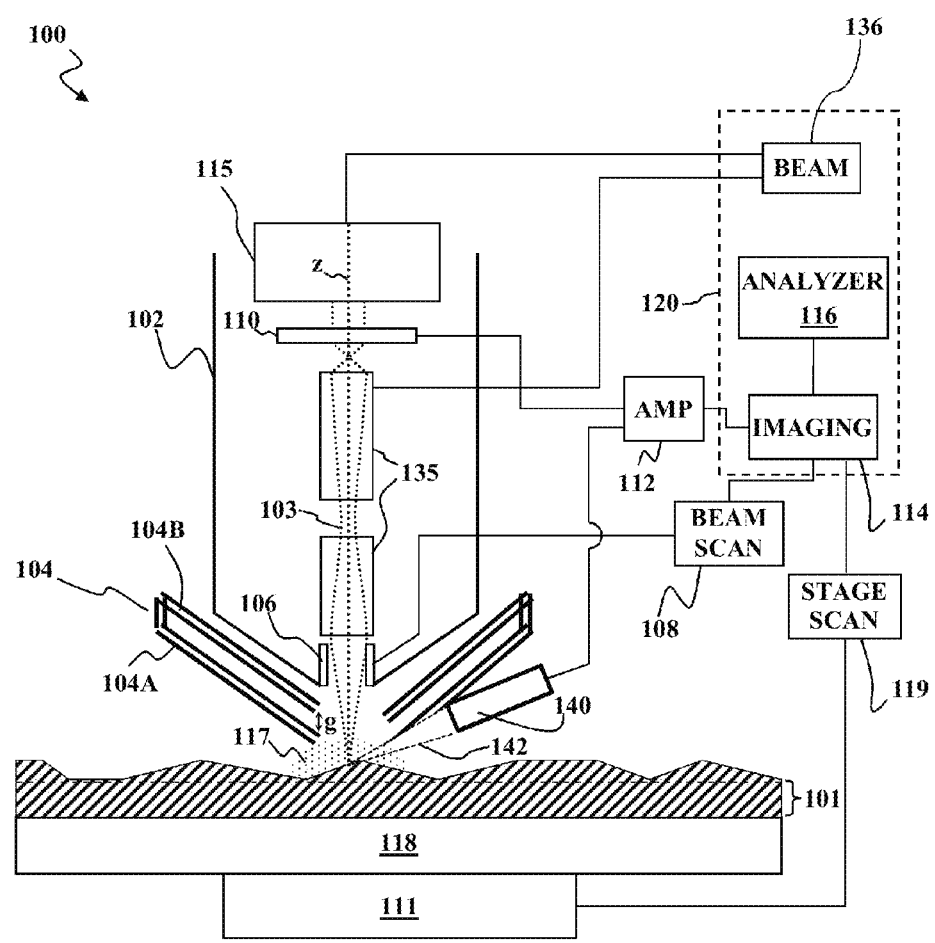
FIGS. 1A-1B illustrate an example of a charged particle beam system according to an aspect of the present disclosure in the form of an Energy Dispersive X-ray (EDX) system.
Figure 1B:
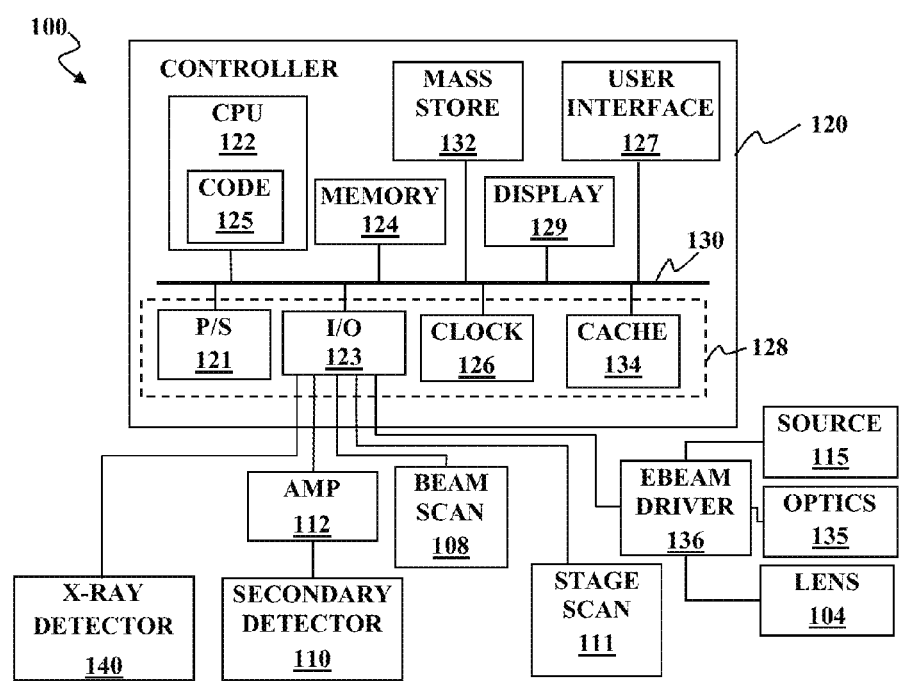

FIG. 1A and FIG. 1B illustrate an example of a charged particle beam system 100 that incorporates certain aspects of the present disclosure. In this non-limiting example, the system 100 is configured as a scanning electron microscope (SEM) having charged particle optical column 102 with an electron source 115, beam optics elements 135, and an immersion lens 104 having an outer pole piece 104A and an inner pole piece 104B. The optical column 102 may be controlled by electronics 136, referred to herein as a beam driver. The beam driver 136 may control the electron source 115, beam optics elements 135 and immersion lens 104. In this example, the beam optics 135 include two or more electrically conductive cylinders maintained at voltages that produce electric fields to extract electrons from the source 115 and form them into a primary beam 103 that travels in the direction of a target 101. The immersion lens 104 focuses the primary beam into a narrow spot at the surface of the target.

Electrons from the electron beam column 102 are focused onto a surface of the target 101, which may be an integrated circuit wafer or a test wafer. The target 101 is supported by a stage 118. The electrons may be scanned across the surface of the target 101, e.g., by magnet deflecting fields provided by one or more electrostatic deflector plates 106. Voltages are provided to the deflector plates 106 via a beam scanner driver 108. In some implementations, the beam scanner driver 108 may apply currents to magnetic coils to scan the electron beam across the target 101. Alternatively, the stage 118 may include a stage scanning mechanism 111 and stage scanner driver 119 configured to move the target along X-Y plane parallel to the surface of the target 101 in one or more directions relative to the optical column 102. In some implementations the stage scanning mechanism 111 and stage scanner driver 119 may move the stage in one direction (e.g., the X direction) as the beam scanner driver 108 scans the beam in a different direction (e.g., the Y direction). Alternatively, the stage scanner driver 119 may drive the stage in both the X and Y directions relative to the optical column 102 to scan the beam across the target while the beam remains fixed relative to the optical column.

Electrons striking the target 101 are either backscattered or initiate secondary emission. The electron beam column collects a portion of such backscattered or secondary electrons 117 (or other secondary particles) that emerge from the surface of the target 101. Some of the secondary particles 117 may travel back up through the electron beam column and impinge on an internal secondary particle detector 110, which generates a secondary signal that is proportional to the amount of backscattering or secondary emission.

Other types of secondary particles 117 are also emitted from the target 101 and may be collected by an external detector 140. For example, characteristic X-rays when the electron beam removes an inner shell electron from the target, causing a higher-energy electron to fill the shell and release energy. A portion of these characteristic X-rays that are within an acceptance cone 142 of the external detector 140 are collected by the external detector, which converts the collected particle energy into voltage signals. The signals may be amplified by an amplifier 112 and analyzed by analyzer 116 for composition identification and measurement of the abundance of elements in the target 101. The landing energy of the electrons of the primary beam 103 at the target 101 may be between about 3000 electron volts (3 keV) and about 30,000 electron volts (30 keV) depending on the desired characteristic X-ray lines of the elements of the target that are to be excited by the primary beam.

The outer pole piece 104A and inner pole piece 104B are substantially symmetric with respect to a common axis, which in the example shown in FIG. 1A is also an axis of symmetry z of the optical column 102. Some variation from axial symmetry is within the scope of the present disclosure. Specifically, during some stage of the machining of the pole pieces, they may be turned on a lathe, resulting in pieces which can be considered symmetric with respect to the axis of the lathe within some degree of tolerance. In addition, subsequent machining may result in one or both of the pole pieces being somewhat non symmetric with respect to this axis in a mathematical sense. For example, according to aspects of the present disclosure, the outer pole piece 104A may include an opening to allow secondary particles 117 in the cone of acceptance 142 to pass through the outer pole piece to the external detector 140. The formation of such an opening on only one side of the outer pole piece 104A does not change the common axis of symmetry of the pole pieces, however.

In alternative implementations, sources of energetic particles other than electrons (e.g., ions, neutrons, ultraviolet radiation, or X-rays) may be used as alternatives to the electron source 115, depending on the nature of the system. By way of example and not by way of limitation, electron beam excitation is used in electron microscopes, scanning electron microscopes (SEM) and scanning transmission electron microscopes (STEM), and X-ray beam excitation is used in X-ray fluorescence (XRF) spectrometers.

As shown in the block diagram of FIG. 1B, the analyzer 116 may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104, the scanning of the electron beam by the coils 106, the scanning of the stage 118 by the stage scanner 111 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135, the secondary detector 110, the X-day detector 140 or amplifier 112 through the I/O functions 123 in response to data and program code instructions stored and retrieved by the memory 124. Depending on the configuration or selection of controller 120, the scanner driver 108, detector 110, and/or amplifier 112, may interface with the I/O functions 123 via conditioning circuits. The conditioning circuits may be implemented in hardware or software form, e.g., within code 125.

Figure 2:
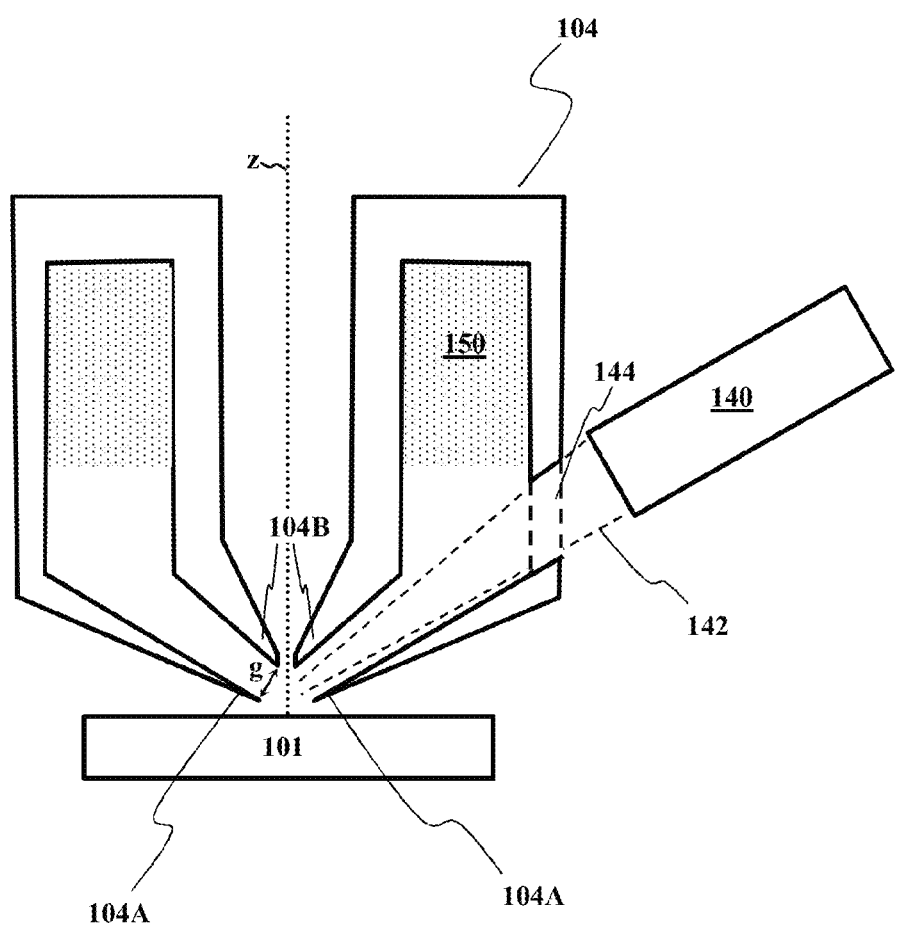
FIG. 2 illustrates a close-up view of a portion of a magnetic immersion lens for a charged particle beam system in accordance with an aspect of the present disclosure.
Figure 3A:
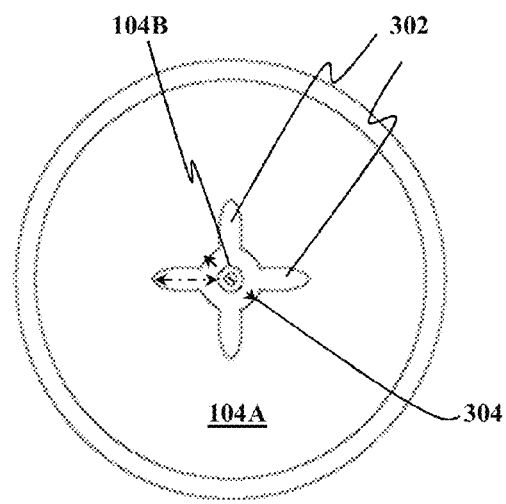
FIG. 3A is a bottom-up view of a portion of a magnetic immersion lens in accordance with an aspect of the present disclosure.
Figure 3B:
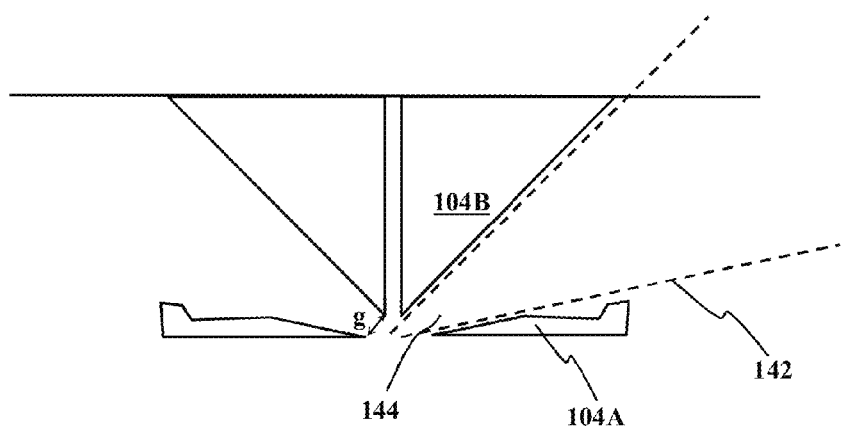
FIG. 3B is a side view of a portion of a magnetic immersion lens in accordance with an aspect of the present disclosure.

FIG. 2 illustrates a close-up view of a portion of an immersion lens 104 of FIG. 1A in accordance with an aspect of the present disclosure. The immersion lens 104 is provided in front of an electron optical column 102 (not shown in FIG. 2) proximate to the target 101. The immersion lens 104 has two magnetically permeable axially-symmetric pole pieces, an outer pole piece 104A and an inner pole piece 104B. As used, herein, the term "outer pole piece" refers to the pole piece closest to the target 101 and the term "inner pole piece" refers to the other pole piece. The terms "front pole piece" and "back pole piece" are sometimes used to refer to the outer and inner pole pieces, respectively. By way of example and not by way of limitation, the pole pieces 104A and 104B are made of soft iron. The immersion lens 104 also include a pair of current carrying coils 150 (e.g., coils of copper wires) inside the pole pieces to produce magnetic field in the pole pieces 104A and 104B respectively. An axially symmetric fringing magnetic field is produced near the target 101 as a result of flux leakage due to a gap g between the inner and outer pole pieces. The gap g may be either a radial gap (as shown in FIGS. 4A-4B and FIGS. 5A-5B) or an axial gap as shown in FIG. 1A or some combination of a radial and axial gap, e.g., as shown in FIG. 2 and FIGS. 3A-3B. The magnetic field focuses charged particles in the primary beam 103 onto the target 101. The gap g between the two pole pieces also allows for X-rays or other secondary particles 117 emitted from the target to pass through toward the external detector 140.

The outer pole piece 140A includes an opening 144 that permits secondary particles 117 from the target 101 to pass through the outer pole piece 104A and into the external detector 140. According to an aspect of the present disclosure, the outer pole piece 104A additionally has a number of notches 302 proximate the gap g, as seen in FIG. 3A. The notches 302 increase the acceptance cone 142 to allow better viewing of the target by the external detector 140 and reduce clipping. FIG. 3A is a bottom-up view of a portion of the immersion lens 104 of FIG. 2, and FIG. 3B is the side view. In the example shown in FIG. 3A, the outer pole piece 104A has four notches 302 near the axis of symmetry of the pole pieces. Portions of the magnetic material in the outer pole piece are cut as a cone projected from focus to form a notch. By way of example and not by way of limitation, notches 302 may be formed by electro discharge machines (EDM) and/or CNC machine. In other embodiments, notches 302 can be cut in the inner pole piece 104B or both the inner and outer pole pieces 104A and 104B. In some implementation, notches 302 are in a cone shape.

These notches 302 allow for a greater viewing cone 142 of the target by the external detector 140. In some embodiments the notches are sized to be large enough to provide the desired access but not so large to increase power needed to drive the lens by more than about 1%.

By way of example and not by way of limitation, the size of a cone-shaped notch 302 may be about 20 mm deep (as shown in FIG. 3A) and about 6 mm in width at the front of the outer pole piece 104A. The radius of the original (i.e., un-notched) aperture (304 of FIG. 3A) in the middle of the outer pole piece 104A is about 8 mm.

The conventional practice is to maintain strictly rotational symmetry of the pole pieces for magnetic immersion lenses proximate the exit aperture. The presence of notches in the inner or outer pole piece proximate the aperture 304 breaks the rotational symmetry in a way that is contrary to accepted practice by those skilled in the art. However, contrary to this conventional wisdom, it turns out to be advantageous to put the notches in the pole pieces if the notches induce relatively weak or easily correctable perturbations to the beam. One notch 302 would introduce a dipole term that would shift the beam. This may be corrected using the deflector plates 106 if the beam shift is not too large. Two notches 302 would introduce a quadrupole perturbation term that would cause astigmatism. However, astigmatism may be corrected by suitably configured beam optics 135 if the quadrupole perturbation is not too large. Three notches would introduce a hexapole perturbation which would make the primary beam spot look like a three leaf clover at the target. As more notches added, the higher order perturbation terms become weaker and thus tend to become obscured by other aberrations. In some implementations, a minimum of four notches may be added to the outer pole piece 104A to eliminate any need for correction.

The three dimensional diagrams shown in FIGS. 4A-5B illustrate the relative configuration of the notches 302 and the opening 144 in the outer pole piece 104A. In FIG. 4A four cone shaped notches formed in the outer pole piece 104A of a magnetic immersion lens 104 in accordance with an aspect of the present disclosure. In this example, the immersion lens 104 was modified from a commercially available electron beam wafer defect review and classification system. FIG. 4B is a bottom up view of FIG. 4A. In the example illustrated in FIGS. 4A-4B, an X-ray detector may be provided with a working distance about 3 mm and 5° half angle from the wafer plane. Portions of the outer pole piece near the axis of the lens are cut out to form 4 notches in a pattern similar to a four leaf clover. Elliptical holes are formed in the side walls as shown in FIG. 4A. No significant increase in the magnetic reluctance of the lens in octopole terms was observed.

Figures 5A, 5B:
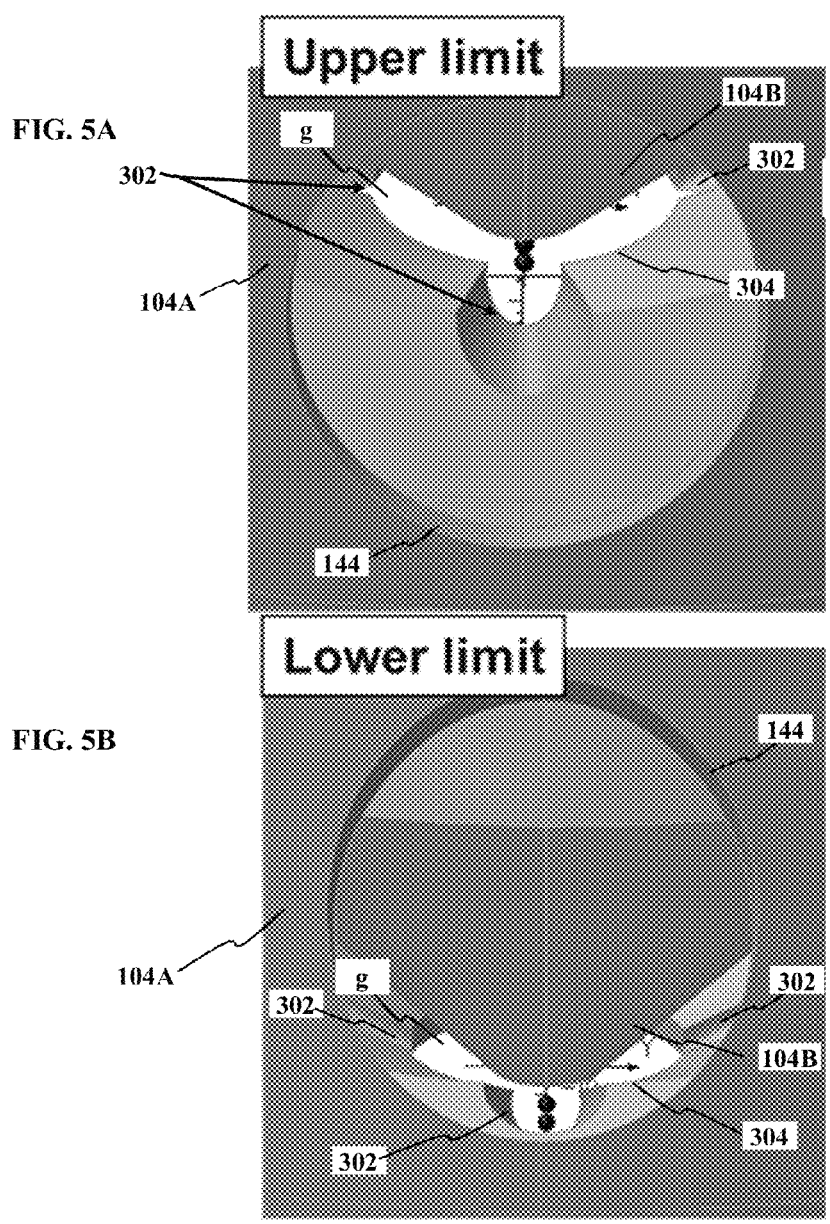
FIGS. 5A-5B are three-dimensional views along an opening in a magnetic immersion lens in accordance with an aspect of the present disclosure.

FIGS. 5A-5B are three-dimensional views through an opening 144 in an immersion lens in accordance with an aspect of the present disclosure. In some embodiments the immersion lens is modified from a commercially available electron beam wafer defect review and classification system. The view depicted in FIG. 5A roughly corresponds to a view along the upper dashed line of the acceptance cone 142 in FIG. 3B. The view depicted in FIG. 5B roughly corresponds to a view along the lower dashed line of the acceptance cone 142 in FIG. 3B. The spheres are located at the intersection of the target 101 and the primary beam optical axis at two different working distances $z=-2.3$ mm and $-3.4$ mm. The working distance z is measured along the axis between the front of the outer pole piece and the target. Both spheres may be seen in FIG. 5A and FIG. 5B, which indicates that the external detector 140 can detect particles originating at the intersection of the beam axis and the target for both working distances.

In application, such immersion lens with notches added to the pole piece near the axis of rotation could be used for optical camera imaging access to a target or to provide illumination, e.g., laser illumination to a target.

It should be noted that in addition to SEM systems, many other charged particle systems may employ the above described immersion lens. Examples of systems may include systems configured to implement focused ion beam (FIB), ultraviolet photoelectron spectroscopy (UPS), X-ray photoelectron spectroscopy (XPS), Auger electron spectroscopy (AES), Helium Ion Microscopy (HIM), and Secondary Ion Mass Spectroscopy (SIMS).

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112(f). In particular, the use of "step of" in the claims herein is not intended to invoke the provisions of 35 USC §112(f).

What is claimed is:

1. A system, comprising:
a charged particle optical column configured to generate a primary beam of charged particles and focus the primary beam onto a target, the charged particle optical column including a magnetic immersion lens provided at a front of the charged particle optical column, the magnetic immersion lens having an outer pole piece and an inner pole piece with a gap therebetween proximate a common axis of the outer and inner pole pieces, the outer pole piece having an opening that permits energetic particles from the target to pass through the outer pole piece to an external detector, wherein the inner or outer pole piece has one or more notches proximate the gap, the notches including at least one notch that expands a cone of acceptance through which the energetic particles can pass from the target to the external detector.

2. The system of claim 1, wherein the one or more notches include two or more notches arranged in an axially symmetric pattern with respect to the axis of the charged particle column.

3. The system of claim 1, wherein the one or more notches include three or more notches arranged in an axially symmetric pattern with respect to the axis of the charged particle column.

4. The system of claim 1, wherein the one or more notches include four or more notches arranged in an axially symmetric pattern with respect to the axis of the charged particle column.

5. The system of claim 1, wherein the notches are large enough to provide a desired access for the detector to the target without increasing power needed to drive the immersion lens by more than 1%.

6. The system of claim 1, wherein the outer pole piece has a number of notches proximate the gap.

7. The system of claim 1, wherein the inner pole piece has a number of notches proximate the gap.

8. The system of claim 1, wherein both the inner pole piece and the outer pole piece have a number of notches proximate the gap.

9. The system of claim 1, wherein the gap is a radial gap.

10. The system of claim 1, wherein the gap is an axial gap.

11. The system of claim 1, further comprising the external detector.

12. The system of claim 11, wherein the external detector is an X-ray detector.

13. The system of claim 12, wherein the charged particle optical column is configured to generate a primary beam of electrons and focus the primary beam of electrons onto the target.

14. A magnetic immersion lens apparatus, comprising:

an outer pole piece and an inner pole piece with a gap therebetween proximate a common axis of the outer and inner pole pieces, the outer pole piece having an opening that permits energetic particles from a target in front of the immersion lens to pass through the outer pole piece to an external detector, wherein the outer or inner pole piece has one or more notches proximate the gap, the notches including at least one notch that expands a cone of acceptance through which the energetic particles can pass from the target to the external detector.

15. The apparatus of claim 14, wherein the one or more notches include two or more notches arranged in an axially symmetric pattern with respect to an axis of a charged particle column.

16. The apparatus of claim 14, wherein the one or more notches include four or more notches arranged in an axially symmetric pattern with respect to an axis of a charged particle column.

17. The apparatus of claim 14, wherein the notches are large enough to provide a desired access for the detector to the target without increasing power needed to drive the immersion lens by more than 1%.

18. The apparatus of claim 14, wherein the outer pole piece has a number of notches proximate the gap.

19. The apparatus of claim 14, wherein the inner pole piece has a number of notches proximate the gap.

20. The apparatus of claim 14, wherein both the inner pole piece and the outer pole piece have a number of notches proximate the gap.

21. The apparatus of claim 14, wherein the gap is a radial gap.

22. The apparatus of claim 14, wherein the gap is an axial gap.

23. An outer pole piece for a magnetic immersion lens, the outer pole piece having an opening that permits energetic particles from a target in front of the immersion lens to pass through the outer pole piece to an external detector, wherein the outer pole piece has one or more notches proximate a central aperture, the notches including at least one notch that expands a cone of acceptance through which the energetic particles can pass from the target to the external detector.

* * * * *